Aug. 4, 1970

D. J. KANTER 3,522,443

LIMITING NETWORK

Filed May 10, 1967

INVENTOR

DANIEL J. KANTER

BY John V. Regan

ATTORNEY

United States Patent Office 3,522,443
Patented Aug. 4, 1970

3,522,443

LIMITING NETWORK

Daniel J. Kanter, Morris Plains, N.J., assignor to RCA Corporation, a corporation of Delaware Filed May 10, 1967, Ser. No. 637,582
Int. Cl. H03k *19/00*
U.S. Cl. 307—203 10 Claims

ABSTRACT OF THE DISCLOSURE

A limiting network is described in the environment of current mode threshold logic gates. A threshold logic gate in accordance with various input signal combinations selectively distributes current to a pair of current carrying lines across which the limiting network is coupled. The limiting network includes a pair of transistors having their collector-emitter paths connected across the lines and their base electrodes coupled to a clamp voltage $V_{CL}$.

CROSS-REFERENCE

An application, Ser. No. 633,825, entitled Logic Circuitry, filed on Apr. 27, 1967, by Robert O. Winder and assigned to the present assignee, describes logic circuit stages useful in threshold logic as well as other logic circuits with which the present invention may be employed.

BACKGROUND OF INVENTION

Limiting networks are useful in many electronic circuits to prevent excessive current and/or voltage from causing component breakdown, undesired transistor saturation, excessive power dissipation and other undesirable effects. In one prior art application, namely, current mode threshold logic gates, it is desirable to prevent transistor saturation. In such gates, current is distributed between a pair of current carrying lines according to various input signal combinations. The gates generally include a number *n* of input current mode switch (CMS) comparators for selectively distributing current to the lines, a summing impedance for each line, and a CMS comparator for comparing the summed currents.

Each CMS comparator includes at least two transistors, one of which is controlled by an associated input signal and the other of which is controlled by the reference voltage $V_{ref}$. The collector electrodes of the CMS input transistors are commonly connected to one of the current carrying lines; while the collector electrodes of the CMS reference transistors are connected to the other current carrying line. The two transistors share a common emitter circuit in which a current source is connected. The current source may be simulated by a source of operating potential and a common current path such as a resistor. According to whether the applied signal voltage is above (more positive than) or below (more negative than) $V_{ref}$, each input comparator routes the current source current to one or the other of the current carrying lines. Separate summing impedances are connected to each of these lines to sum the current contributions provided by the CMS transistors. For some input signal combinations, these summed current contributions cause the output lines to assume voltages which may cause the saturation of either the input or output CMS comparator transistors.

The present invention relates to a limiting network which maintains a minimum current flow in a pair of current carrying lines, while preventing excessive current flow in either of the lines. In particular, the invention is useful in current mode threshold logic gates to prevent undesirable transistor saturation.

BRIEF SUMMARY OF INVENTION

According to one example of the invention, the limiting network includes a pair of transistors having their collector-emitter paths connected across the lines. The base electrodes of the transistor pair are coupled to a clamping voltage $V_{CL}$. For cases where the current distribution between the lines is fairly even or differs only slightly (as for example, by one unit of current where each comparator supplies one or more units depending upon its weight), neither of the transistor pair is turned on. When the input signal combinations cause a more unbalanced current distribution thereby causing the voltage of one of the lines to vary below $V_{CL}$, one of the transistor pair turns on to draw current from one line and supply current to the other line in such a manner as to prevent further voltage variations despite more extreme current distribution.

According to another example of the invention, a control circuit is provided for obtaining the clamping voltage $V_{CL}$. The control circuit includes a comparator having three transistors arranged in an emitter-coupled current mode configuration. Two of these transistors are controlled by the voltages across the summing impedances; while the third transistor is connected to a reference voltage $V_R$. The clamping voltage $V_{CL}$ is obtained from the collector electrode of the third transistor. As the voltage across one of the summing impedances varies above $V_R$, $V_{CL}$ varies in a direction tending to turn on one of the limiting network transistor pairs. As the current distribution becomes more extreme, the clamping voltage $V_{CL}$ varies even more in the direction which tends to make the on one of the transistor pair conduct even more current, thereby tending to stabilize the voltages of the current carrying lines.

DESCRIPTION OF PREFERRED EMBODIMENTS

Limiting networks according to the invention may be constructed either with discrete components or by means of integrated circuit processes. As used herein, the term, "integrated circuit," refers to those technologies by which an entire circuit can be formed as by diffusion or by films in or on one or more chips of materials, such as silicon, glass, sapphire, and the like.

Figure 1:
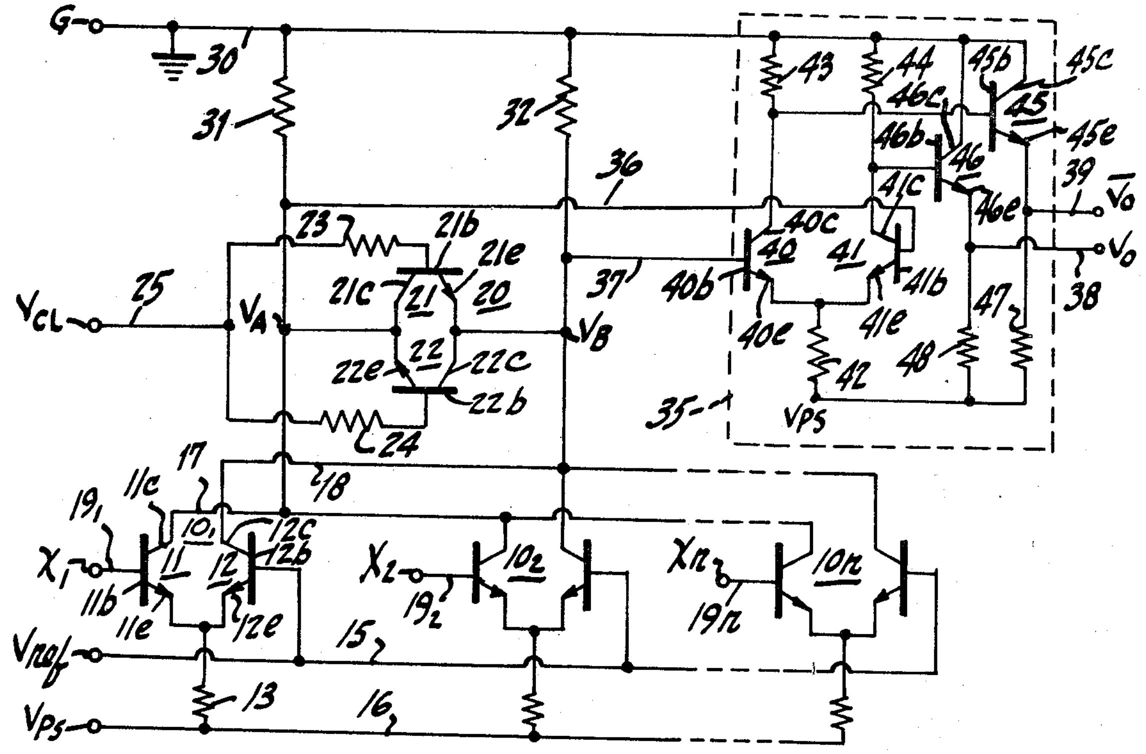
FIG. 1 is a schematic circuit diagram of the limiting network according to the present invention in the environment of a current mode threshold logic gate.

While not limited to any particular application or circuit environment, the limiting network of the present invention is illustrated, by way of example, in a current mode threshold logic circuit. Referring now to FIG. 1, there is illustrated a current mode threshold logic circuit wherein the limiting network according to the invention is illustrated generally at 20 as being connected between a pair of current carrying conductors or lines 17 and 18. The term, line, as used herein and in the appended claims is intended to mean a connector or conductor of negligible or incidental impedance. That is, the line may have impedance due to the nature of the material used to implement the line; but such impedance is incidental to the connecting and current carrying functions of the line. For example, an integrated circuit array may employ appropriately shaped diffused regions of semiconductor material to effect connector cross-overs. These diffused connector regions generally have more resistivity or impedance than a metallic connector; but this impedance is incidental to the connecting function.

The limiting network 20 includes a pair of transistors 21 and 22. The collector electrode 21*c* and the emitter electrode 22*e* are connected together and to line 17; while the emitter electrode 21*e* and the collector electrode 22*c* are connected together and to the line 18, thereby forming a parallel collector-emitter path combination for the two transistors. The base electrodes 21*b* and 22*b* are connected by way of separate base resistors 23 and 24, respectively, to a common clamping line 25. The clamping line 25 is connected to receive a clamping voltage designated $V_{CL}$.

In the current mode threshold logic circuit the current carrying lines 17 and 18 are the output lines for a number *n* of current mode switch (CMS) input comparators designated $10_1$, $10_2$, . . . and $10_n$. Each of the comparators has an associated input signal line $19_1$, $19_2$, . . . $19_n$ each connected to receive an associated input signal $X_1$, $X_2$ . . . and $X_n$, respectively. Since each of the CMS comparators is substantially identical, only the CMS comparator $10_1$ will be described in detail. The comparator $10_1$ includes a pair of transistors 11 and 12 having their emitter electrodes 11*e* and 12*e* connected in common and by way of an emitter resistor 13 to a power supply line 16. The power supply line 16 is connected to receive a source of operating voltage designated $V_{PS}$, which source may be a battery. The base electrode 11*b* is connected to the comparator input line $19_1$ to receive the input signal voltage $X_1$. The base electrode 12*b* is connected to a reference voltage line 15 which is connected to receive a reference voltage designated $V_{ref}$. The reference voltage $V_{ref}$ may be derived by any suitable means, for example, by way of a voltage divider arrangement from the power supply voltage $V_{PS}$. The collector electrodes 11*c* and 12*c* are connected to the output lines 17 and 18, respectively.

Each of the other comparator circuits is connected in a like manner to the $V_{PS}$ line 16, the $V_{ref}$ line 15 and the common output lines 17 and 18. The collector circuits for all of the comparators are completed by way of load impedances 31 and 32 which connect the output lines 17 and 18, respectively, to a supply line 30. The supply line 30 is arbitrarily considered as the ground reference for the threshold logic circuit.

The function of discrimination or comparison with threshold is performed by a discrimination circuit 35. The circuit 35 has a pair of inputs 36 and 37 connected to the output lines 17 and 18, respectively, and a pair of output terminals 38 and 39, also designated $V_0$ and $\overline{V}_0$, respectively.

Discrimination circuit 35 is illustrated as an output CMS comparator having a pair of CMS transistors 40 and 41. The base electrodes 41*b* and 40*b* are connected to the input lines 36 and 37. The emitter electrodes 40*e* and 41*e* are connected together and by way of common emitter resistor 42 to the supply voltage $V_{PS}$. The collector electrodes 40*c* and 41*c* are connected by way of separate collector resistors 43 and 44 to the ground line G. The collector electrodes of the CMS transistors 40 and 41 are further connected to the base electrodes 45*b* and 46*b* of a pair of output emitter-follower transistors 45 and 46. The emitter-follower transistors 45 and 46 each have their collector electrodes 45*c* and 46*c* connected to the ground line G and their emitter electrodes 45*e* and 46*e* connected by way of emitter resistors 47 and 48 to the $V_{PS}$ supply line. The output terminals 38 and 39 are connected to the emitter electrodes 46*e* and 45*e*.

In the operation of the illustrated NPN transistor threshold logic circuit, $V_{PS}$ has a value more negative than the ground reference G, and $V_{ref}$ has a value in between $V_{PS}$ and G, whereby $V_{ref}$ can be obtained by means of a voltage divider. In addition the signal voltages $X_1$ through $X_n$, $V_0$ and $\overline{V}_0$ have either high (HI) or low (LO) values relative to $V_{ref}$. For the purpose of the description which follows, the HI and LO signals are considered as 1 and 0 signals, respectively.

Referring in particular to the operation of the comparator $10_1$, the voltage $V_{PS}$ and the common emitter resistor 13 simulate a source of current for the current switches, e.g., transistors 11 and 12. Whenever the applied signal voltage $X_1$ is a 1 signal, transistor 11 is turned on and the transistor 12 is turned off. The current source current is routed through the collector-to-emitter path of transistor 11, the output line 17 and the load resistor 31. On the other hand, when the applied signal voltage $X_1$ is a 0 signal, the transistor 12 is turned on and the transistor 11 is turned off. For this input signal condition, the current source current is routed through the collector-to-emitter path of the transistor 12, the output line 18 and the load resistor 32.

Each of the other input comparators respond to their applied input signals to provide their respective current contributions to the output line 17 or 18, according to whether the respective input voltages are 1 or 0 signals. The current contributions of the individual input comparators may be different according to binary input weighting factors. For example, the *i*th binary input may have a weight $w_i$, where $w_i$ is an integer. The inputs can be weighted, for instance, by applying the same input signals to two or more input lines. Thus, when $n=5$, if one signal is applied to two of the 5-input lines, a (2111) gate results—weights respectively 2, 1, 1 and 1. Another way of weighting the inputs is to divide the *i*th comparator emitter resistor 13 by the weight $w_i$ as, for example, by connecting $w_i$ resistors of equal value in parallel.

The output current contributions of the comparators are effectively summed by the load resistors 31 and 32 with the difference therebetween being detected by the threshold discriminator 35 to provide the output signals $V_0$ and $\overline{V}_0$. It should be noted that the total current flow in the load resistors is always the same but is differently distributed in accordance with the input signals.

In a 7-input majority gate ($n=7$, and all weights are unity) by way of example, there are 7 units of current distributed between the lines 17 and 18. When all 7 input signal voltages are 1 signals, 7 units of current are routed through line 17 and no units of current are routed through line 18. On the other hand, when all 7 input voltages are 0 signals, 7 units of current are routed through line 18 and no units of current are routed through line 17. In such a gate the closest decision (comparison with threshold) is determined when the current distribution is 4 units in one line and 3 units in the other line.

The routing of current in the output CMS comparator is controlled by the difference in current flow in lines 17 and 18, i.e., the difference in voltage drops across resistors 31 and 32. For the preceding 7-input majority gate example, the output comparator current routing is switched between alternate current paths provided by the output CMS transistors 40 and 41 as the input signals change from 3 or less "1" signals to 4 or more "1" signals or from 4 or more "1" signals to 3 or less "1" signals.

One of the principal features of the current mode switch comparators is that they can be operated in a nonsaturated manner, thereby contributing to high-speed operation. In a threshold logic circuit as described above, the summed current contributions cause IR voltage drops across the load resistors 31 and 32. For some circuit designs, the voltage drops render the comparator output lines 17 and 18 sufficiently negative to saturate the transistors in the input comparators $10_1$ through $10_n$ or sufficiently positive to saturate the output CMS comparator transistors depending upon the distribution of the input comparator current contributions between the lines 17 and 18. The network of the present invention enables circuit designs which limit the current distribution and therefore the voltage drops across the summing load resistors 31 and 32 to the closest decision case, which for the 7-input majority gate is 4 current units in one line and 3 current units in the other line. That is, the limiting network not only prevents one line from becoming too low, but also prevents the other line from becoming too high, thereby tending to prevent saturation of both the input and output CMS transistors.

The limiting network 20 operates as follows. The values of resistors 13, 31, 32 and sources $V_{ref}$, $V_{PS}$ and $V_{CL}$ are selected so that for the closest decision case neither the transistor 21 nor the transistor 22 is turned on. For this case, the voltages $V_A$ and $V_B$ at lines 17 and 18 are primarily a function of the IR voltage drops across load resistors 31 and 32. For the 7-input majority gate example where four of the inputs are 1 (HI) signals, the voltage $V_A$ is −4 IR volts, where I is defined as a unit of current and R is defined as the value of load resistor 31. This value for $V_A$ is chosen to be sufficiently positive to provide a reliable margin of saturation prevention.

The voltage $V_{CL}$ is suitably chosen so that when current distribution deviations from the closest decision case cause either the voltage $V_A$ or the voltage $V_B$ to become more negative, the corresponding transistor 21 or 22 turns on. For example, where more than four 1-input signals are applied, more units of current tend to flow through resistor 31 and less units of current flow through resistor 32. The voltage $V_A$ tends to become more negative; while the voltage $V_B$ tends to become more positive. However, transistor 22 turns on to limit the amount of current drawn through the load resistor 31 and thereby limit the voltage $V_A$. Transistor 22 draws collector current by way of load resistor 32, thereby tending to make $V_B$ more negative or tending to limit the positive or high voltage excursion thereof. On the other hand, the emitter current of transistor 22 flows to the ON transistors 11 of the input comparators. In other words, transistor 22 responds to more than four 1-input signals to draw current through load resistor 32 and supply current to line 17 and the ON transistors 11 to thereby limit both $V_A$ and $V_B$. For current distributions corresponding to less than three 1-input signals, the transistor 21 operates similarly to limit the current flow in resistor 32.

The base resistors 23 and 24 are provided for the purpose of limiting the base current to transistors 21 or 22. In the case above where there are more than four "1"-input signals, it is desired that current flow in the collector-to-emitter circuit of transistor 22. However, the characteristics of some NPN transistors will also permit some current to flow in the base-to-collector circuit and the emitter-to-collector circuit of transistor 21. This current is undesirable since the current gain of some transistors operated in this mode is near unity. In order to limit this current, resistors 23 and 24 are provided.

Figure 2:
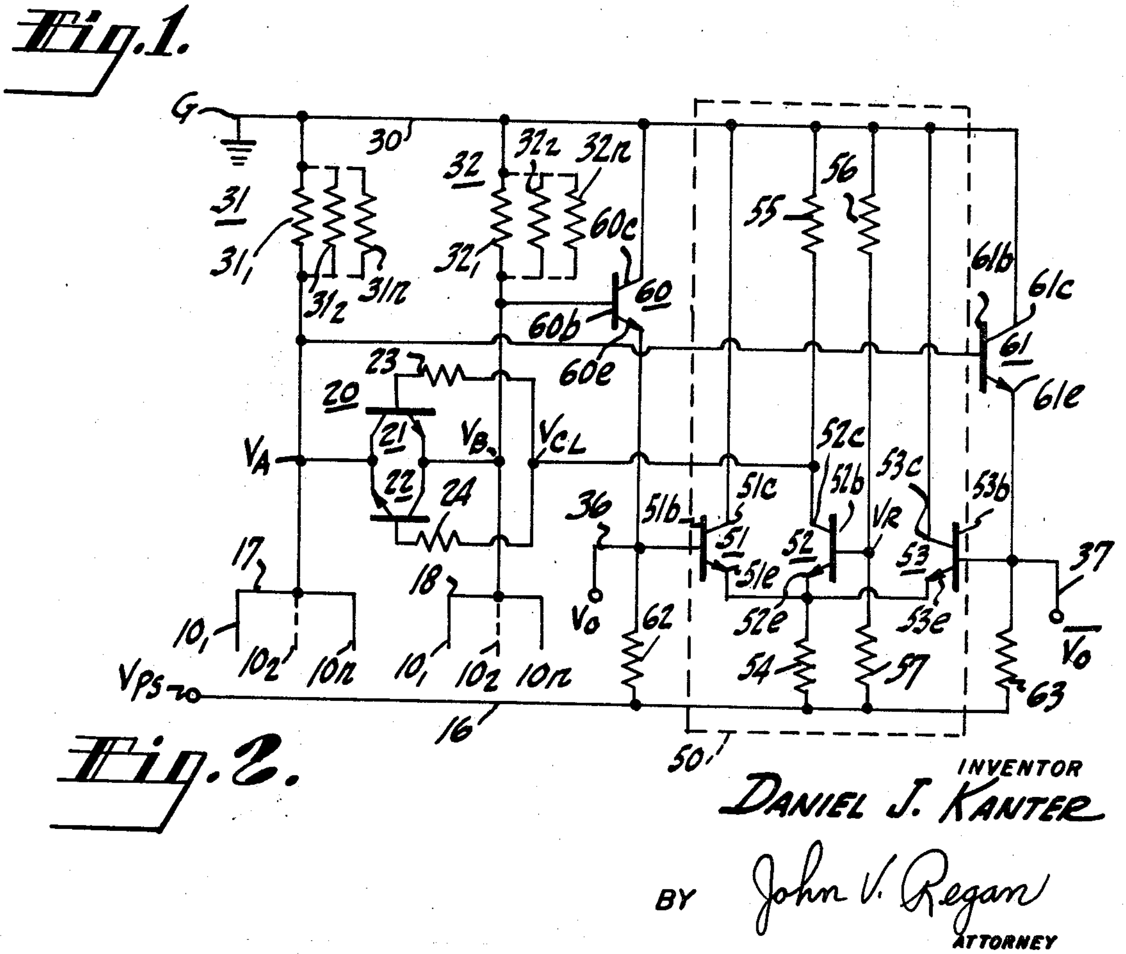
FIG. 2 is a circuit diagram of a further embodiment of the invention.

Referring now to FIG. 2, another embodiment of the invention includes a voltage clamping $V_{CL}$ control circuit 50 for use with the limiting network 20. Since the limiting network, current carrying lines and threshold logic circuit bear physical resemblance to the FIG. 1 circuit, like reference characters denote like components.

Certain modifications from the FIG. 1 threshold logic circuit are illustrated in FIG. 2 for the purpose of demonstrating the use of the $V_{CL}$ circuit with threshold logic circuits as described in the aforementioned copending application of Robert O. Winder. As described therein, the load or summing resistors for the input comparators may be comprised of *n* parallel-connected resistors, where *n* is the number of input comparators. Thus, load resistors 31 and 32 are shown as having parallel-connected resistors $31_1$, $31_2$, . . . and $31_n$ and $32_1$, $32_2$, . . . and $32_n$, respectively. In order to simplify the illustration and conserve space on the drawing, the input comparators are not shown in detail. Instead, the lines 17 and 18 are designated as being connected to each of the comparators by the reference characters $10_1$, $10_2$, . . . and $10_n$.

Also as described in the copending application, the output lines 17 and 18 are connected by way of emitter-follower transistors 60 and 61 to output terminals 36 and 37, also designated $V_0$ and $\overline{V}_0$, respectively. To this end, the base electrodes **60*b* and 61*b* are connected to lines 18 and 17, respectively; the collector electrodes 60*c* and 61*c* are connected to the ground line G; and the emitter electrodes 60*e* and 61*e* are connected to the output terminals 36 and 37, respectively. The emitter electrodes 60*e* and 61*e* are further connected by way of emitter resistors 62 and 63** to the $V_{PS}$ line.

The function of discrimination (comparison with threshold) is performed by the input comparator of the next or driven stage or stages which is or are connected to the output terminals 36 and 37 as described in the copending application. In accordance with the description therein, the logic signals for the FIG. 2 circuits are such that any signal voltage values above (more positive than) the reference voltage $V_{ref}$ are of a first binary significance and any signal voltage values below (more negative than) $V_{ref}$ are of a second binary significance. For the purpose of the description which follows, these first and second binary significances are arbitrarily considered as binary 1 and binary 0 signals.

The voltage clamping control circuit 50 includes three transistors 51, 52 and 53 arranged in an emitter-coupled, current mode configuration. To this end, the emitter electrodes **51*e*, 52*e* and 53*e* are coupled together and by way of a common emitter resistor 54 to the $V_{PS}$ line. The collector electrodes 51*c* and 53*c* are coupled by way of negligible impedance means to the ground line G; while the collector electrode 52*c* is connected by way of a collector resistor 55 to the ground line G. The collector electrode 52*c* is further connected to the $V_{CL}$ circuit point for the limiting network 20. The base electrodes 51*b* and 53*b* are connected to the output terminals 36 and 37, respectively, while the base electrode 52*b* is connected to receive a reference voltage $V_R$ which may be different from $V_{ref}$. The reference voltage $V_R$ may be derived from the $V_{PS}$ and ground G lines by way of a voltage divider. The voltage divider is illustrated as including a first resistor 56 connected between the ground line G and the base electrode 52*b* and a second resistor 57 connected between the $V_{PS}$ line and the base electrode 52*b***.

In operation, if either the output $V_0$ or $\overline{V}_0$ rises above (becomes more positive than) $V_R$, the clamp voltage $V_{CL}$ rises, thereby causing more current flow between the lines 17 and 18 when either transistor 21 or 22 is conducting. For the 7-input majority gate example, the closest decision case is the 4:3 current distribution between the lines 17 and 18. For this case, the clamp voltage $V_{CL}$ is of such value that neither transistor 21 nor transistor 22 is conducting as described for the FIG. 1 circuit. That is, the output $V_0$ or $\overline{V}_0$, as the case may be, which is above $V_R$ is not sufficiently positive to cause $V_{CL}$ to rise enough to turn on either of the transistors 21 or 22.

For current distributions of more than four 1-input signals, the line 18 becomes more positive. The output $V_0$ rises causing $V_{CL}$ to rise, whereby transistor 22 turns on. As more and more 1 signals are applied, $V_{CL}$ tends to rise even more causing transistor 22 to conduct more and more current. That is, transistor 22 tends to draw more current through the load resistor 32 and supply more current to line 17.

For current distributions corresponding to less than three 1-input signals, the line 17 becomes more positive, the output $\overline{V}_0$ rises, thereby causing $V_{CL}$ to rise, and since $V_A$ is more positive than $V_B$ transistor 21 turns on. As less and less 1 signals are applied, $V_{CL}$ tends to rise even more causing transistor 21 to conduct more and more current.

In summary, the $V_{CL}$ control circuit responds to the output signals $V_0$ and $\overline{V}_0$ to cause the clamp voltage $V_{CL}$ to render the ON one of the transistors 21 and 22 more or less conductive according to the input signal combinations, thereby maintaining the outputs within set limits and preventing saturation of the CMS input comparators for this stage as well as for the succeeding or driven stage.

The invention has been illustrated with NPN transistors by way of example only and is not limited in application to the use thereof. For instance, PNP transistors or other amplifying devices may also be used in the practice of the invention, provided that appropriate signal and bias voltages are accordingly altered.

What is claimed is:

1. In combination:
a current source;
a pair of current carrying lines coupled to said source, each for carrying a portion of the source current;
an impedance in each line for developing a voltage proportional to the flow of current through its line;
a pair of amplifying devices direct-current connected in parallel across said lines, one connected to carry current in the one direction and the other connected to carry current in the opposite direction; and
means for biasing said amplifying devices at a level such that when the voltage at one line exceeds that at the other by more than a given value, current flows between the two lines in one direction through one amplifying device and when the voltage at the other line exceeds that of the one line by more than said given value, current flows between the two lines in the opposite direction through the other amplifying device.

2. The invention according to claim 1
wherein the amplifying devices are transistors having collector-emitter paths corresponding to the conduction paths and having base electrodes corresponding to the control electrodes.

3. The invention according to claim 2
wherein the first and second transistors are of like conductivity, and
wherein the collector electrode of the first transistor is connected to the emitter electrode of the first transistor and vice versa.

4. The invention according to claim 3, further including a resistor in series with each base electrode.

5. A network for apparatus wherein input means selectively distributes current to a pair of current carrying lines, said network comprising:
first and second amplifying devices, each having a conduction path connected across the lines and each having a control electrode;
means for coupling the control electrodes to a control voltage;
said input means having a number $n$ of input current mode comparators for distributing current to the lines in accordance with various input signal combinations which are applied to the comparators; and
each line including a summing impedance.

6. The invention according to claim 5
wherein the amplifying devices are transistors having collector-emitter paths corresponding to the conduction paths and having base electrodes corresponding to the control electrodes,
wherein the control voltage is derived from a control circuit which includes
third, fourth and fifth transistors connected in an emitter-coupled current mode comparator configuration,
means for coupling the base electrodes of the third and fourth transistors to different ones of the summing impedances,
means for coupling the base electrode of the fifth transistor to a reference voltage, and
means for obtaining the control voltage from the collector electrode of the fifth transistor.

7. The invention according to claim 6
wherein sixth and seventh emitter-follower transistors couple different ones of the summing impedances to the base electrodes of the third and fourth transistors, respectively.

8. The combination comprising:
first and second lines for carrying current, each line producing a voltage drop proportional to the current therethrough;
input current switching means having at least one input node adapted to receive input signals and first and second outputs coupled, respectively, to said first and second lines for distributing a relatively constant current between said lines;
bidirectional current carrying means having conduction path means coupled between said two output lines and a control means separate from said conduction path means for controlling the conductivity of said conduction path means; and
means for applying a control signal to said control means for causing said bidirectional means to divert current from the one of the lines carrying the lesser current to the line carrying the greater current when the voltage drop of the latter exceeds a given value of potential.

9. The combination as claimed in claim 8
wherein said bidirectional current carrying means includes two transistors having their conduction paths connected in parallel and their control electrodes connected to said means for applying a control signal.

10. In combination with a differential amplifier stage having: (a) first and second differential input signal terminals, (b) a common impedance element for carrying the current of said stage, and (c) first and second differential outputs for producing complementary signals in response to signals applied at said input terminals, the improvement comprising:
amplifying means having a conduction path and a control electrode separate from said conduction path for controlling the conductivity of said path;
means for applying a bias voltage to said control electrode; and
means directly connecting said conduction path between said differential outputs for causing said conduction path to carry current from one differential output to the other when the potential at the latter exceeds said bias potential.

References Cited

UNITED STATES PATENTS

| | | | |
|---|---|---|---|
| 2,863,123 | 12/1958 | Koch | 307—237 |
| 3,283,067 | 11/1966 | Bazin et al. | 307—237 |
| 3,379,940 | 5/1968 | Nakao | 307—235 |
| 3,418,584 | 12/1968 | Payne | 328—104 |

DONALD D. FORRER, Primary Examiner

B. P. DAVIS, Assistant Examiner

U.S. Cl. X.R.

307—237, 241, 247